(12) United States Patent
Tamura et al.

(10) Patent No.: US 7,244,628 B2
(45) Date of Patent: Jul. 17, 2007

(54) METHOD FOR FABRICATING SEMICONDUCTOR DEVICES

(75) Inventors: Satoshi Tamura, Osaka (JP); Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 10/849,823

(22) Filed: May 21, 2004

(65) Prior Publication Data
US 2004/0235210 A1 Nov. 25, 2004

(30) Foreign Application Priority Data
May 22, 2003 (JP) .............................. 2003-144480

(51) Int. Cl.
H01L 21/00 (2006.01)
(52) U.S. Cl. .......................................... 438/33; 438/22
(58) Field of Classification Search ................. 438/22, 438/33
See application file for complete search history.

(56) References Cited

U.S. PATENT DOCUMENTS 6,071,795 A * 6/2000 Cheung et al. ............. 438/458
2001/0042866 A1 * 11/2001 Coman et al. ............... 257/103
2003/0189215 A1 * 10/2003 Lee et al. ..................... 257/94
2004/0140474 A1 7/2004 Ueda et al.
2004/0245543 A1 * 12/2004 Yoo ............................ 257/103
2006/0202211 A1 9/2006 Ueda et al.

FOREIGN PATENT DOCUMENTS

JP 2001-274507 A 10/2001
JP 2004-88083 3/2004

* cited by examiner

Primary Examiner—B. William Baumeister
Assistant Examiner—Matthew L. Reames
(74) Attorney, Agent, or Firm—McDermott Will & Emery LLP

(57) ABSTRACT

A method for fabricating semiconductor devices forms a semiconductor layer containing a positive layer on a mother substrate and then forms a metal layer on the semiconductor layer. After forming the metal layer, the method separates the mother substrate from the semiconductor layer and then removes a desired region of the metal layer from the exposed surface of the semiconductor layer from which the mother substrate has been separated to form a plurality of mutually separated semiconductor devices each containing the semiconductor layer.

13 Claims, 8 Drawing Sheets

METHOD FOR FABRICATING SEMICONDUCTOR DEVICES

BACKGROUND OF THE INVENTION

The present invention relates to a method for fabricating nitride semiconductor light-emitting devices which emit light in blue-to-ultraviolet regions.

Currently, light-emitting diodes each using a group III nitride have been widely commercialized for various types of displays, large-scale displays, signal lights, or the like. In addition, white LEDs each composed of a combination of a GaN LED and a fluorescent material have also been commercialized and expected to replace lighting devices used at present provided that the light emission efficiencies thereof will be improved in future.

In general, a group III nitride semiconductor (hereinafter simply referred to as a nitride semiconductor) composed of GaN or the like has been formed on a sapphire substrate as mainstream practice. However, since the sapphire substrate has no conductivity, it is necessary to form a p-type electrode and an n-type electrode on the same plane in a GaN growth layer. This causes the problem of increased series resistance due to an elongated current path and the problem of increased device size.

To solve the foregoing problems, a laser lift-off (hereinafter referred to as LLO) technology has been developed.

The LLO technology is a method which grows a GaN layer on a sapphire substrate and irradiates the side of the GaN layer formed with the sapphire substrate with a laser to thermally decompose the portion of the GaN layer located in proximity to the interface between the GaN layer and the sapphire substrate and thereby separate the sapphire substrate from the GaN layer.

A description will be given herein below to a method for fabricating semiconductor devices according to a first conventional embodiment using the LLO technology with reference to FIGS. 7A to 7F (see Japanese Laid-Open Patent Publication No. 2001-274507).

First, as shown in FIG. 7A, a GaN layer 102 is deposited on a sapphire substrate 101.

Next, as shown in FIG. 7B, an electrode layer 103 is formed on the GaN layer 102 and then insulating films 104 are formed on specified regions of the electrode layer 103.

Next, as shown in FIG. 7C, a Cu plate 105 with a thickness of about 50 μm is formed on the electrode layer 103. In this case, Cu is not plated on the insulating films 104, while the Cu plate 105 having a configuration as shown in FIG. 7C is formed on the electrode layer 103.

Next, as shown in FIG. 7D, a holding metal 106 is formed over the Cu plate 105.

Next, as shown in FIG. 7E, the sapphire substrate 101 is separated from the GaN layer 102 by using the LLO technology. Then, electrode layers 107 are formed on specified regions of the GaN layer 102. Subsequently, the holding metal 106 is separated from the Cu plate 105. In FIG. 7E and also in FIG. 7F, which will be described later, the orientation of the drawing has been vertically inverted from that of the drawing in each of FIGS. 7A to 7D.

Next, as shown in FIG. 7F, the GaN layer 102 is scribed to be cleaved such that individual chips are separated from each other. In this case, since the bonded portion 105a (see FIG. 7F) of the Cu plate 105 is relatively low in bonding strength, the Cu plate 105 is also easily separated by cleaving the GaN layer 102.

A description will be given to a method for fabricating semiconductor devices according to a second conventional embodiment using the LLO technology with reference to FIGS. 8A to 8F (see Japanese Patent Application No. 2002-183919).

First, as shown in FIG. 8A, a GaN layer 202 is deposited on a sapphire substrate 201.

Next, as shown in FIG. 8B, an electrode layer 203 is formed on the GaN layer 202 and then an Au plate 204 with a thickness of 10 μm or more is formed thereon.

Next, as shown in FIG. 8C, the sapphire substrate 201 is separated from the GaN layer 202 by using the LLO technology.

Next, as shown in FIG. 8D, electrode layers 205 are formed on the exposed surface of the GaN layer from which the sapphire substrate 201 has been removed.

Next, as shown in FIG. 8E, a resist pattern 206 is formed on the Au plate 204 and then the Au plate 204 is patterned such that the portion of the Au plate 204 serving as a chip isolation region is removed. In this case, the portion of the Au plate 204 is removed by performing wet etching with respect to the surface of the Au plate 204 opposite to the surface thereof formed with the GaN layer 202.

Next, a shown in FIG. 8F, the resist pattern 206 is removed by organic cleaning. Then, the GaN layer 202 is cleaved or cut by using a dicing blade such that the individual chips are separated from each other.

Thus, the nitride semiconductor devices have been fabricated by using the LLO technology as shown in the foregoing first and second conventional embodiments.

However, the methods for fabricating semiconductor devices according to the first and second conventional embodiments encounter the following problems.

First, in the method for fabricating semiconductor devices according to the first conventional embodiment, the function of the thin-film GaN layer 102 as a holding member is degraded if the bonding strength of the Cu plate 105 is extremely low. Consequently, there are cases where the GaN layer 102 is naturally split in the step of performing cleavage. Since such naturally split chips mostly have rough and uneven surfaces, they cannot be used as devices, which causes a reduction in yield. Conversely, if the bonding strength of the Cu plate 105 is high, there are cases where the Cu plate 105 is not separated even when the thin-film GaN layer 102 is separated by cleavage, which also causes a reduction in yield. Thus, the method for fabricating semiconductor devices according to the first conventional embodiment requires strict control of the bonding strength of the Cu plate.

In the method for fabricating semiconductor devices according to the second conventional embodiment, the resist pattern is formed on the thick-film Au plate 204, as described above with reference to FIG. 8E. If the film thickness of the Au plate 204 is large, however, it is difficult during patterning to recognize a layer serving as an underlie for the Au plate 204 so that mask alignment becomes difficult, which causes a reduction in yield. There are also cases where the thin-film GaN layer 202 is naturally separated at the stage at which the portion of the Au plate 204 serving as the chip isolation region has been removed, which also causes a reduction in yield in the same manner as in the first conventional embodiment. Thus, it is also difficult to achieve a high yield even in accordance with the method for fabricating semiconductor devices according to the second embodiment.

SUMMARY OF THE INVENTION

In view of the foregoing, it is therefore an object of the present invention to provide a method for fabricating semiconductor devices which prevents a reduction in yield and allows a plurality of semiconductor devices to be separated from each other.

To solve the foregoing problems, the method for fabricating semiconductor devices according to the present invention comprises the steps of: forming a semiconductor layer containing a positive layer on a mother substrate; forming a metal layer on the semiconductor layer; separating the mother substrate from the semiconductor layer after forming the metal layer; and removing a desired region of the metal layer from an exposed surface of the semiconductor layer from which the mother substrate has been separated to form a plurality of mutually separated semiconductor devices each containing the semiconductor layer.

Since the method for semiconductor devices according to the present invention uses the indiscrete metal layer as a holding member, unlike in the conventional embodiments, and separates the devices by removing the metal layer, not by cleavage, it can improve the yield by solving problems associated with cleavage as shown in the conventional embodiments. For the removal of the metal layer, patterning is performed by forming a resist pattern on the semiconductor layer, not on the metal layer, and the metal layer is removed from the exposed surface of the semiconductor layer from which the mother substrate has been separated. This significantly facilitates mask alignment and improves the yield.

In the method for fabricating semiconductor devices according to the present invention, the metal layer is preferably composed of Au, Ag, or Cu.

Since these materials are high in heat conductivity, each of the devices has an improved heat releasing property.

In the method for fabricating semiconductor devices according to the present invention, the metal layer is preferably formed by plating.

In the method for fabricating semiconductor devices according to the present invention, the metal layer preferably has a film thickness of 10 μm or more.

The arrangement effectively provides the metal layer with a sufficient ability to hold the semiconductor layer.

In the method for fabricating semiconductor devices according to the present invention, the step of separating the mother substrate is preferably performed by irradiating a side of the semiconductor layer formed with the mother substrate with a laser.

The arrangement allows short-time separation of the mother substrate under easy control.

In the method for fabricating semiconductor devices according to the present invention, the step of separating the mother substrate may also be performed by polishing.

The method for fabricating semiconductor devices according to the present invention further comprises, between the step of forming the semiconductor layer and the step of separating the mother substrate, the step of: partly removing the semiconductor layer from a side of the semiconductor layer opposite to the side thereof formed with the mother substrate to separate the semiconductor layer into a plurality of regions, wherein the plurality of semiconductor devices contain the plurality of respective regions.

Since the semiconductor layer has been separated into the plurality of regions before the mother substrate is separated, the tendency of the semiconductor layer prone to splitting when the mother substrate is separated can be suppressed. This makes it possible to provide a large margin for laser irradiation conditions when the mother substrate is separated by using, e.g., laser irradiation and improve the yield.

Preferably, the method for fabricating semiconductor devices according to the present invention further comprises, between the step of forming the metal layer and the step of forming the plurality of semiconductor devices, the step of: forming a polymer material film having an adhesive property on a surface of the metal layer opposite to a surface thereof formed with the semiconductor layer.

The arrangement can prevent the plurality of individual semiconductor devices, which are to be separated in a subsequent stage, from falling apart.

In the method for fabricating semiconductor devices according to the present invention, the polymer material film is preferably composed of a material having a stretching property.

The arrangement allows the polymer film to be used as an expand sheet after the completion of the devices and thereby reduces the number of fabrication process steps.

The method for fabricating semiconductor devices according to the present invention further comprises, between the step of forming the metal layer and the step of separating the mother substrate, the step of: forming a semiconductor substrate having a cleaving property on a surface of the metal layer opposite to a surface thereof formed with the semiconductor layer.

The arrangement enhances the ability to hold the semiconductor layer after the mother substrate is separated and thereby allows separation of the plurality of semiconductor devices with a high yield.

In the method for fabricating semiconductor devices according to the present invention, the semiconductor substrate is preferably composed of Si or SiC.

The arrangement allows each of the semiconductor devices to function as a heat sink when it is mounted so that a mounting step is simplified.

In the method for fabricating semiconductor devices according to the present invention, the step of forming the plurality of semiconductor devices includes the steps of: forming a trenched portion in a surface of the semiconductor substrate which has been exposed by removing the desired region of the metal layer; and cleaving the semiconductor substrate formed with the trenched portion to form the plurality of semiconductor devices.

The arrangement allows the cleavage of the semiconductor substrate to occur along the trenched portion and therefore easier cleavage of the semiconductor substrate. As a result, the yield can further be improved.

In the method for fabricating semiconductor devices according to the present invention, the semiconductor layer is preferably composed of a group III nitride semiconductor.

DETAILED DESCRIPTION OF THE INVENTION

Figure 1A:
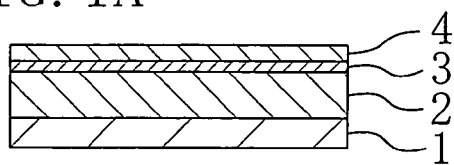
FIGS. 1A to 1H are cross-sectional views illustrating the principal process steps of a method for fabricating semiconductor devices according to a first embodiment of the present invention.

Referring to the drawings, the individual embodiments of the present invention will be described herein below.

EMBODIMENT 1

Referring to FIGS. 1A to 1H, a method for fabricating semiconductor devices according to a first embodiment of the present invention will be described by using, as a specific example, a method for fabricating blue surface emitting devices each composed of a nitride semiconductor.

As a system for growing a GaN layer, a MOVPE (metal organic vapor phase epitaxy) system is used. As a Ga raw material, trimethylgallium is used, while $NH_3$ is used as an N raw material. As an Si raw material serving as a donor impurity, $SiH_4$ is used, while $H_2$ is used as a carrier gas.

First, as shown in FIG. 1A, a low-temperature buffer layer (not shown) is formed on a 2-inch (0001) sapphire substrate 1. Then, an n-type GaN layer 2 is grown on the low-temperature buffer layer to have a film thickness of 4 µm. In this case, a growth temperature for the GaN layer 2 is 1030° C. Subsequently, the carrier gas is switched to $N_2$ and the growth temperature is reduced to 800° C. so that an active layer 3 made of InGaN is grown on the GaN layer 2 to have a film thickness of 20 nm. In the present embodiment, blue light at a wavelength of 470 nm is emitted from the active layer 3 made of InGaN. As an In raw material, trimethylindium is used. Although the present embodiment has assumed the case where the active layer 3 has an SQW structure, the active layer 3 may also have an MQW structure instead. Then, the growth temperature is increased again to 1020° C. such that a p-type GaN layer 4 is grown on the active layer 3 to have a film thickness of 0.8 µm. As an Mg raw material which is an acceptor impurity, cyclopentadienylmagnesium is used.

Next, a p-type GaN layer 4 is grown and then annealing is performed in a nitrogen atmosphere at 750° C. for 20 minutes by using an annealing system such that the resistance is further lowered.

Figure 1B:
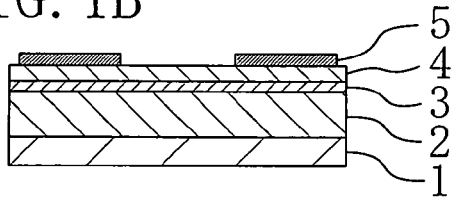

Next, as shown in FIG. 1B, Ni/Au multilayer films are formed as p-type contact electrodes 5 by EB vapor deposition on the p-type GaN layer 4. Thereafter, sintering is performed in an oxygen atmosphere at 600° C.

Figure 1C:
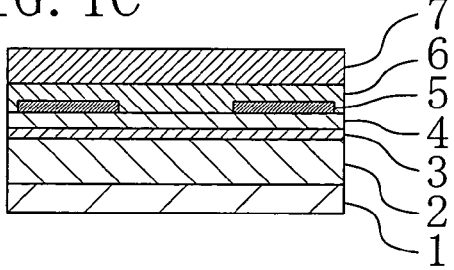

Next, as shown in FIG. 1C, a Ti/Au multilayer film is formed as an underlying film 6 for Au plate by EB vapor deposition over the entire surface of the sample. Thereafter, an Au plate 7 is formed on the underlying film 6 to have a film thickness of 30 µm. The Au plate 7 operates as a member for holding the n-type GaN layer 2 when the sapphire substrate 1 is removed from the n-type GaN layer 2 having a film thickness of about 5 µm in a subsequent step. The holding ability of the Au plate 7 increases as the film thickness thereof becomes larger but an excessively large film thickness degrades the heat releasing property of each of the devices. Accordingly, the film thickness of the Au plate 7 is preferably in the range of about 10 to 150 µm. As stated previously, the present embodiment has adjusted the film thickness of the Au plate 7 to 30 µm. As the material of a metal layer having a large film thickness, a material having a high heat conductivity is preferred. Besides Au, Ag or Cu can be listed as a candidate for the material. Although the present embodiment has formed the Au plate by plating, it may also be formed by a method other than plating.

Figure 1D:
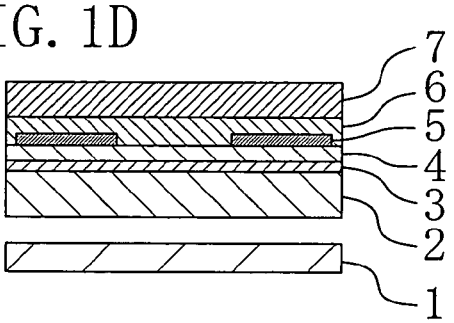

Next, as shown in FIG. 1D, the sapphire substrate 1 is removed from the n-type GaN layer 2. As a method for removing the sapphire substrate 1, a polishing process, a laser lift-off (LLO) process, or the like may be used. Since the sapphire substrate 1 is extremely firm and solid, the removal of the sapphire substrate 1 using a polishing process has the problem that it requires a long time and it is difficult to control. In view of the problem, the present embodiment has removed the sapphire substrate 1 by using the laser lift-off process. Specifically, the portion of the n-type GaN layer 2 located in proximity to the interface between the n-type GaN layer 2 and the sapphire substrate 1 is thermally decomposed by irradiating the surface of the sapphire substrate 1 opposite to the surface thereof formed with the n-type GaN layer 2 with a YAG laser so that the sapphire substrate 1 is separated from the n-type GaN layer 2. After the laser lift-off process, a Ga metal resulting from the decomposition is adhered to the portion of the n-type GaN layer 2 located in proximity to the interface so that it is removed by using a hydrochloric acid. Because the laser lift-off process has roughened the surface, the light extraction efficiency of each of the LEDs is improved compared with the case where the surface is flat and even. It is also possible to further roughen the surface with the view to further improving the light extraction efficiency.

Figure 1E:
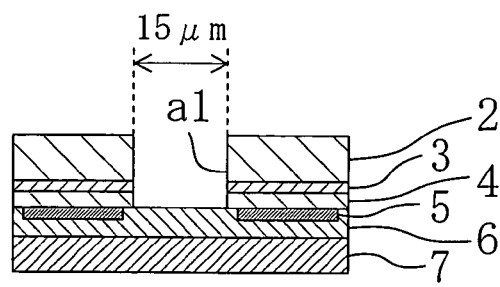

Next, as shown in FIG. 1E, a mask is formed on the exposed surface of the n-type GaN layer 2 from which the sapphire substrate 1 has been separated and then the portions of the nitride semiconductor layers which are present in the chip isolation region of each of the n-type GaN layer 2, the active layer 3, and the p-type GaN layer 4 are removed completely by dry etching, whereby an opening a1 having a diameter of 15 µm and serving as the chip isolation region is formed in the n-type GaN layer 2, the active layer 3, and the p-type GaN layer 4. Thereafter, the used mask is removed. As an etching gas for dry etching, a chlorine-based gas, e.g., is used. The mask is preferably composed of a material resistant to dry etching, such as a dielectric film made of $SiO_2$ or the like or a metal film made of Ni or the like. In the case of using a resist, the resist preferably has a large film thickness. The orientation of the drawing in each of FIGS. 1A to 1D has been vertically inverted from that of the drawing in FIG. 1E. The same shall apply to each of FIGS. 1F to 1H, which will be described later.

Figure 1F:
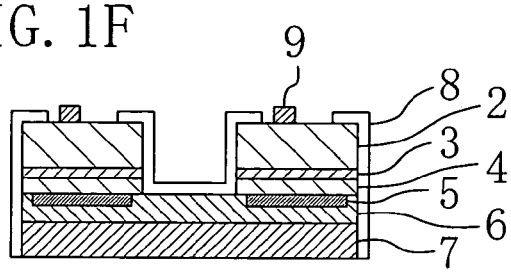

Next, as shown in FIG. 1F, a passivation film 8 composed of an $SiO_2$ film is formed by CVD or sputtering over the entire surface of the sample and then the portions of the passivation film 8 corresponding to the light extraction portions of the devices are removed. Thereafter, Ti/Au multilayer films are formed as n-type electrodes 9 on the exposed portions of the n-type GaN layer 2 from which the passivation film 8 has been removed and then sintering is performed in a nitrogen atmosphere at 600° C. As the n-type electrodes 9, transparent electrodes made of ITO, $\beta$-$Ga_2O_3$, or the like may also be used.

Figure 1G:
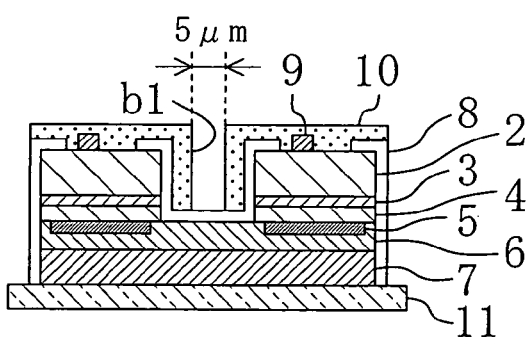

Next, as shown in FIG. 1G, a resist mask 10 is formed entirely over the passivation film 8, the n-type GaN layer 2, and the n-type electrodes 9 and then an opening b1 is formed in a part of the chip isolation region of the resist mask 10. The present embodiment forms the opening b1 such that only the center portion of the chip isolation region which corresponds to 5 µm is opened, while the chip isolation region has a width of 15 µm. Then, a sheet 11 is adhered onto the surface of the Au plate 7 opposite to the surface thereof formed with the nitride semiconductor layers. The sheet 11 prevents the individual chips, which are to be separated in a subsequent step, from falling apart. The sheet 11 is composed of a polymer material film and has an adhesive property. By using a polymer film having a stretching property as the sheet 11, the sheet 11 can also be used as an expand sheet after the completion of the devices so that the number of fabrication process steps is reduced. The sheet 11 may also be attached immediately before or after the separation of the sapphire substrate 1 by using the LLO process. The arrangement enhances the ability to hold the n-type GaN layer 2 when the sapphire substrate 1 is separated or in the process of forming the n-type electrodes 9.

Figure 1H:
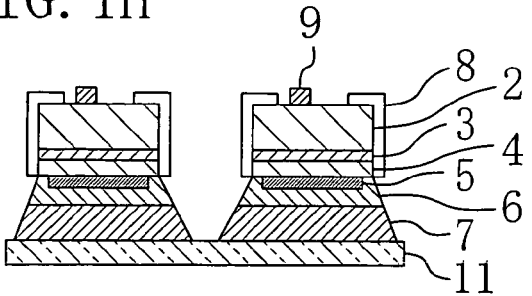

Next, as shown in FIG. 1H, the portion of the passivation film 8 composing the bottom portion of the opening b1 and the portion of the Ti film composing the underlying film 6 which is located therebelow are removed so that Au composing the underlying film 6 is exposed. Then, wet etching is performed with respect to the Au composing the exposed underlying film 6 and the Au plate 7 positioned under the Au by using iodine to provide two mutually separated chips containing the nitride semiconductor layers. Thereafter, the resist mask 10 is removed by, e.g., organic cleaning, whereby the blue LEDs are fabricated.

Thus, in accordance with the method for fabricating semiconductor devices according to the first embodiment, the indiscrete Au plate is used as a holding member, unlike in the conventional embodiments, and device separation is performed not by cleavage but by removing the Au plate by wet etching. As shown in the conventional embodiments, cleavage for device separation has encountered the problem that the nitride semiconductor layers each having a small film thickness are naturally split or the plate layer remains in an indiscrete state and, as a result, device separation cannot be accomplished. However, the present embodiment can solve the problem and improve the yield. When the Au plate is etched, a resist pattern is formed on the nitride semiconductor layers, the nitride semiconductor layers are patterned, and then etching is performed with respect to the Au plate from the side of the nitride semiconductor layers on which the sapphire substrate has been formed. In contrast to the conventional embodiments in which mask alignment has been difficult when the resist pattern is formed on the Au plate, the present embodiment facilitates mask alignment and improves the yield.

This allows the fabrication of blue LEDs with an excellently high yield. Each of the fabricated devices has an extremely excellent heat releasing property since heat is released through the thin-film Au plate with a thickness of 30 µm.

Although the present embodiment has described the case where the GaN layer is grown on the sapphire substrate 1, the present invention is also applicable to each of a substrate and a growth layer composed of other semiconductor materials.

EMBODIMENT 2

Referring to FIGS. 2A to 2H, a method for fabricating semiconductor devices according to a second embodiment of the present invention will be described by using, as a specific example, a method for fabricating blue surface emitting devices each composed of a nitride semiconductor. In FIGS. 2A to 2H, the components corresponding to those shown in the drawings described above are designated by the same reference numerals.

Figure 2A:
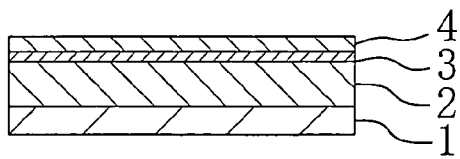
FIGS. 2A to 2H are cross-sectional views illustrating the principal process steps of a method for fabricating semiconductor devices according to a second embodiment of the present invention.

First, as shown in FIG. 2A, the steps of successively depositing the n-type GaN layer 2, the active layer 3, and the p-type GaN layer 4 on the sapphire substrate 1 and performing annealing are performed in the same manner as in the first embodiment that has been described with reference to FIG. 1A.

Figure 2E:
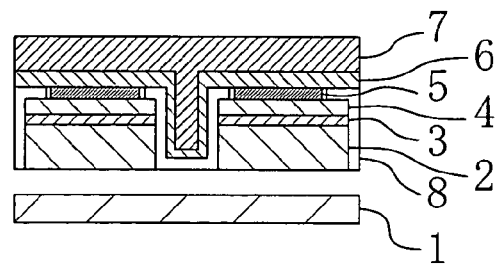
Figure 2B:
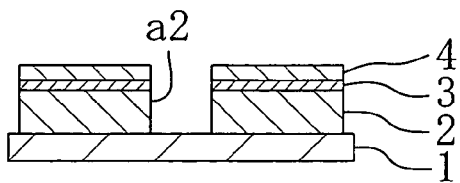

Next, as shown in FIG. 2B, a mask is formed on the p-type GaN layer 4 and then the portions of the nitride semiconductor layers which are present in the chip isolation region of each of the n-type GaN layer 2, the active layer 3, and the p-type GaN layer 4 are etched away, whereby an opening a2 is formed. In this case, dry etching such as RIE or ECR is performed preferably as an etching process. As an etching gas, a chlorine-based gas is used preferably. Thereafter, the used mask is removed. The mask is preferably composed of a material resistant to dry etching such as a dielectric film made of $SiO_2$ or the like or a metal film made of Ni or the like. In the case of using a resist, the resist preferably has a large film thickness.

Figure 2F:
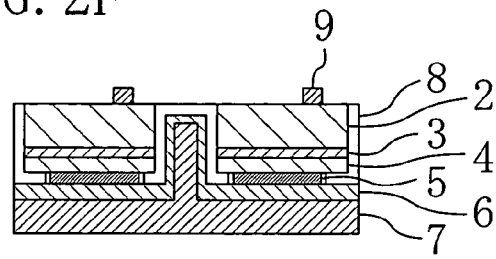
Figure 2C:
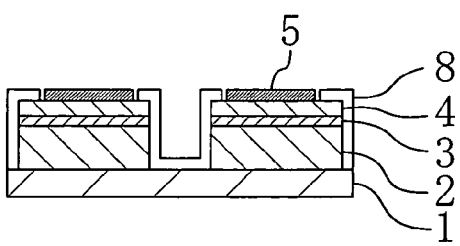

Next, as shown in FIG. 2C, the passivation film 8 composed of an $SiO_2$ film is formed by CVD or sputtering over the entire surface of the sample including the opening a2 and then the current waveguide portions of the passivation film 8 are removed. Subsequently, Ni/Au multilayer films are formed as the p-type electrodes 5 by EB vapor deposition on the respective exposed portions of the p-type GaN layer 4 from which the passivation film 8 has been removed. Thereafter, sintering is performed in an oxygen atmosphere at 600° C.

Figure 2G:
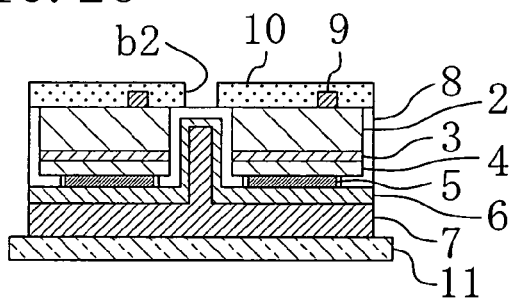
Figure 2D:
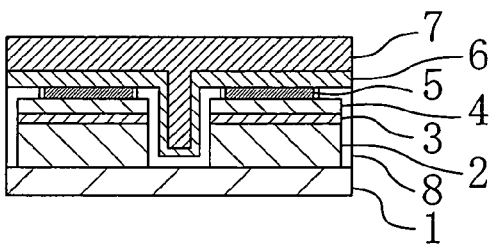

Next, as shown in FIG. 2D, a Ti/Au multilayer film is formed as the underlying film 6 for Au plate by EB vapor deposition over the entire surface of the sample and then the Au plate 7 is formed on the underlying film 6 to have a film thickness of 30 µm. The Au plate 7 operates as a member for holding the n-type GaN layer 2 when the sapphire substrate 1 is removed from the thin-film n-type GaN layer 2 in a subsequent step.

Next, as shown in FIG. 2E, the sapphire substrate 1 is removed from the n-type GaN layer 2. As a method for removing the sapphire substrate 1, a polishing process, a laser lift-off (LLO) process, or the like may be used. Since the sapphire substrate 1 is extremely firm and solid, the removal of the sapphire substrate 1 using a polishing process has the problem that it requires a long time and it is difficult to control. In view of the problem, the present embodiment has removed the sapphire substrate 1 by using the laser lift-off process. Specifically, the portion of the n-type GaN layer 2 located in proximity to the interface between the n-type GaN layer 2 and the sapphire substrate 1 is thermally decomposed by irradiating the surface of the sapphire substrate 1 opposite to the surface thereof formed with the n-type GaN layer 2 with a YAG laser so that the sapphire substrate 1 is separated from the n-type GaN layer 2. After the laser lift-off process, a Ga metal resulting from the decomposition is adhered to the portion of the n-type GaN layer 2 located in proximity to the interface so that it is removed by using a hydrochloric acid. Because the laser lift-off process has roughened the surface, the light extraction efficiency of each of the LEDs is improved compared with the case where the surface is flat and even. It is also possible to further roughen the surface with the view to further improving the light extraction efficiency.

Thus, the present embodiment has performed dry etching prior to the separation of the sapphire substrate 1 by the laser lift-off process so that the n-type GaN layer 2 has been divided into parts each of a size corresponding to one device when the laser lift-off process is performed. When the sapphire substrate 1 is separated from the n-type GaN layer 2 having a large area of 2 inches as in the first embodiment, the n-type GaN layer 2 is prone to splitting during the laser lift-off process so that a margin for laser irradiation conditions is extremely reduced. By contrast, the present embodiment separates the sapphire substrate 1 from each of the parts of the n-type GaN layer 2 corresponding to one device by the laser lift-off process. This allows the provision of a large margin for laser irradiation conditions and improves the yield.

Next, as shown in FIG. 2F, Ti/Au multilayer films are formed as the n-type electrodes 9 by EB vapor deposition on the exposed surface of the n-type GaN layer 2 from which the sapphire substrate 1 has been separated and then sintering is performed in an $N_2$ atmosphere at 600° C. The orientation of the drawing in each of FIGS. 2A to 2E has been vertically inverted from that of the drawing in FIG. 2F. The same shall apply to each of FIGS. 2G and 2H.

Next, as shown in FIG. 2G, the resist mask 10 is formed to cover the n-type electrodes 9 and then an opening b2 for partly opening the chip isolation region is formed in the resist mask 10. Subsequently, the sheet 11 having an adhesive property is adhered onto the surface of the Au plate 7 opposite to the surface thereof formed with the nitride semiconductor layers.

Figure 2H:
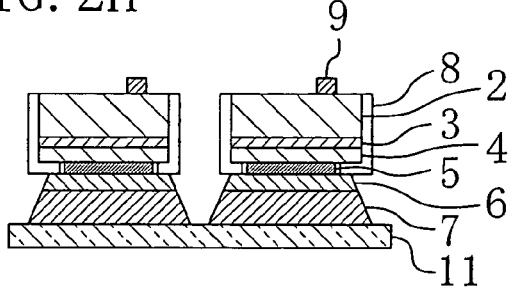

Next, as shown in FIG. 2H, the respective portions of the passivation film 8 and the Ti film composing the underlying film 6 which are formed inside the opening a2 are removed by using BHF and then wet etching is performed with respect to Au composing the underlying film 6 and the Au plate 7 located under the Au by using iodine, thereby providing two mutually separated chips containing the nitride semiconductor layers. Thereafter, the resist mask 10 is removed by, e.g., organic cleaning, whereby the blue LEDs are fabricated.

Thus, in accordance with the method for fabricating semiconductor devices according to the second embodiment, the indiscrete Au plate is used as the holding member, unlike in the conventional embodiments, and device separation is performed not by cleavage but by removing the Au plate by wet etching. As shown in the conventional embodiments, cleavage for device separation has encountered the problem that the nitride semiconductor layers each having a small film thickness are naturally split or the plate layer remains in an indiscrete state and, as a result, device separation cannot be accomplished. However, the present embodiment can solve the problem and improve the yield. When the Au plate is etched, a resist pattern is formed on the nitride semiconductor layer, the nitride semiconductor layers are patterned, and then etching is performed with respect to the Au plate from the side of the nitride semiconductor layers on which the sapphire substrate has been formed. In contrast to the conventional embodiments in which mask alignment has been difficult when the resist pattern is formed on the Au plate, the present embodiment facilitates mask alignment and improves the yield. In addition, the nitride semiconductor layers have been divided by dry etching into parts each of a size corresponding to one device when the laser lift-off process is performed. This prevents the splitting of a wafer during the laser lift-off process and improves the yield.

This allows the fabrication of blue LEDs with an excellently high yield. Each of the fabricated devices has an extremely excellent heat releasing property since heat is released through the thin-film Au plate with a thickness of 30 μm.

Although the present embodiment has described the case where the GaN layer is grown on the sapphire substrate 1, the present invention is also applicable to each of a substrate and a growth layer composed of other semiconductor materials.

EMBODIMENT 3

Referring to FIGS. 3A to 3I, a method for fabricating semiconductor devices according to a third embodiment of the present invention will be described by using, as a specific example, a method for fabricating blue surface emitting devices each composed of a nitride semiconductor. In FIGS. 3A to 3I, the components corresponding to those shown in the drawings described above are designated by the same reference numerals.

As a system for growing a GaN layer, a MOVPE (metal organic vapor phase epitaxy) system is used. As a Ga raw material, trimethylgallium is used. As an Al raw material, trimethylaluminum is used, while $NH_3$ is used as an N raw material. As an Si raw material serving as a donor impurity, $SiH_4$ is used, while $H_2$ is used as a carrier gas. As an Mg raw material serving as an acceptor impurity, cyclopentadienylmagnesium is used.

Figure 3A:
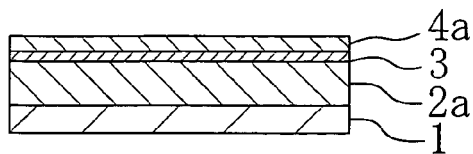
FIGS. 3A to 3I are cross-sectional views illustrating the principal process steps of a method for fabricating semiconductor devices according to a third embodiment of the present invention.

First, as shown in FIG. 3A, the low-temperature buffer layer (not shown) is formed on the 2-inch (0001) sapphire substrate 1. Then, an n-type layer 2a composed of an n-GaN layer, an n-$Al_{0.15}Ga_{0.85}N$ clad layer, and an n-$Al_{0.07}Ga_{0.93}N$ guide layer which are stacked successively is formed on the low-temperature buffer layer. Then, the active layer 3 made of InGaN and having the MQW structure is formed on the n-type layer 2a. Thereafter, a p-type layer 4a composed of a p-$Al_{0.07}Ga_{0.93}N$ guide layer, a p-$Al_{0.15}Ga_{0.85}N$ clad layer, and a p-GaN contact layer which are stacked successively is formed on the active layer 3. In the present embodiment, blue light at a wavelength of 405 nm is emitted from the active layer 3 made of InGaN and having the MQW structure.

Figure 3B:
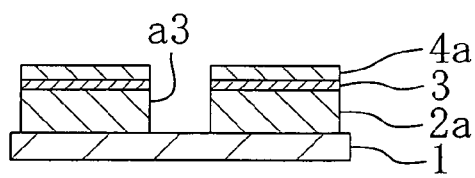

Next, as shown in FIG. 3B, a mask is formed on the p-type layer 4a and then the portions of the nitride semiconductor layers which are present in the chip isolation region of each of the n-type layer 2a, the active layer 3, and the p-type layer 4a are etched away, whereby an opening a3 is formed. In this case, dry etching such as RIE or ECR is performed preferably as an etching process. As an etching gas, a chlorine-based gas is used preferably. Thereafter, the used mask is removed. The mask is preferably composed of a material resistant to dry etching, such as a dielectric film made of $SiO_2$ or the like or a metal film made of Ni or the like. In the case of using a resist, the resist preferably has a large film thickness.

Figure 3C:
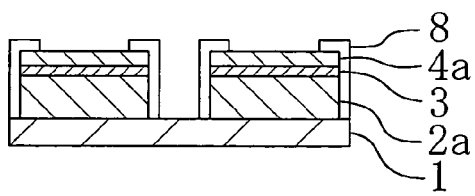

Next, as shown in FIG. 3C, the passivation film 8 composed of an $SiO_2$ film is formed by CVD or sputtering over the entire surface of the sample and then the portions of the passivation film 8 corresponding to the light extraction portions of the devices and the current waveguide portions are removed. Subsequently, Ni/Au multilayer films are formed as the p-type electrodes 5 by EB vapor deposition on the portions of the p-type layer 4a other than the optical waveguides and exposed as a result of the removal of the passivation film 8. Thereafter, sintering is performed in an oxygen atmosphere at 600° C.

Figure 3D:
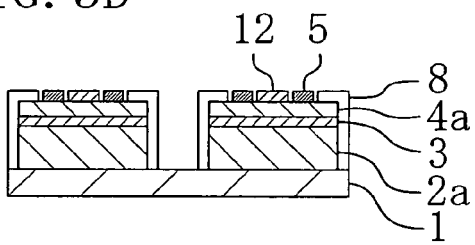

Next, as shown in FIG. 3D, dielectric DBR mirrors 12 are formed on the portions of the p-type layer 4a which are exposed and will serve as the optical waveguides. The dielectric DBR mirrors 12 are constructed to have a reflectivity of 99.5% or more with respect to light at a wavelength of 405 nm.

Figure 3E:
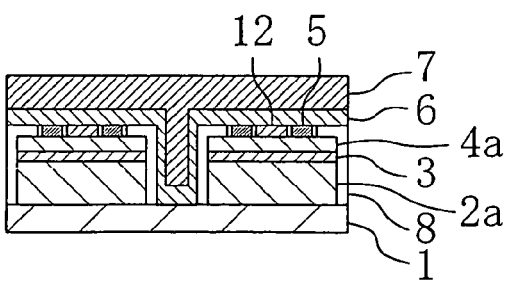

Next, as shown in FIG. 3E, a Ti/Au multilayer film is formed as the underlying film 6 for Au plate by EB vapor deposition over the entire surface of the sample and then the Au plate 7 is formed on the underlying film 6 to have a film thickness of 30 µm. The Au plate 7 operates as a member for holding the n-type layer 2a when the sapphire substrate 1 is removed from the thin-film n-type layer 2a in a subsequent step.

Figure 3F:
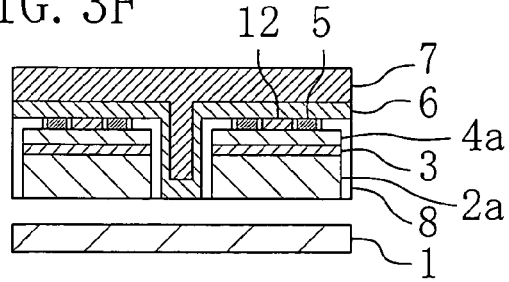

Next, as shown in FIG. 3F, the sapphire substrate 1 is removed from the n-type layer 2a. As a method for removing the sapphire substrate 1, a polishing process, a laser lift-off (LLO) process, or the like may be used. Since the sapphire substrate 1 is extremely firm and solid, the removal of the sapphire substrate 1 using a polishing process has the problem that it requires a long time and it is difficult to control. In view of the problem, the present embodiment has removed the sapphire substrate 1 by using the laser lift-off process. Specifically, the portion of the n-type layer 2a located in proximity to the interface between the n-type layer 2a and the sapphire substrate 1 is thermally decomposed by irradiating the surface of the sapphire substrate 1 opposite to the surface thereof formed with the n-type layer 2a with a YAG laser so that the sapphire substrate 1 is separated from the n-type layer 2a. After the laser lift-off process, a Ga metal resulting from the decomposition is adhered to the portion of the n-type layer 2a located in proximity to the interface so that it is removed by using a hydrochloric acid. By thus performing dry etching before the sapphire substrate 1 is separated by the laser lift-off process, the sapphire substrate 1 is separated from the individual parts of the n-type layer 2a each corresponding to one device by the laser lift-off process. This allows the provision of a large margin for laser irradiation conditions and improves the yield in the same manner as in the second embodiment.

Figure 3G:
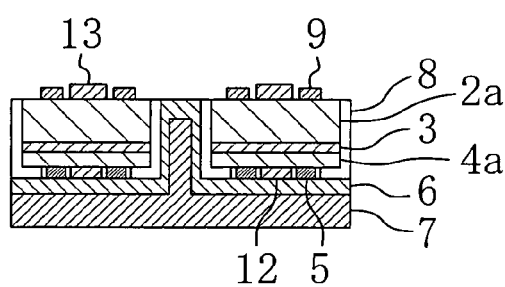

Next, as shown in FIG. 3G, Ti/Au multilayer films are formed as the n-type electrodes 9 by EB vapor deposition on the surface portions of the n-type layer 2a other than the optical waveguides and exposed as a result of the separation of the sapphire substrate 1. Thereafter, sintering is performed in a nitrogen atmosphere at 600° C. Then, dielectric DBR mirrors 13 are formed on the surface portions of the n-type layer 2a corresponding to the optical waveguides and exposed as a result of the separation of the sapphire substrate 1. The dielectric DBR mirrors 13 are constructed to have a reflectivity of 99% or more with respect to a wavelength of 405 nm. Although the present embodiment has formed the DBR mirrors on the n-type layer 2a by using a dielectric material, the DBR mirrors may also be formed by using growth layers and the difference between the respective refractive indices of AlGaN materials having different compositions. The orientation of the drawing in each of FIGS. 3A to 3F has been vertically inverted from that of the drawing in FIG. 3G. The same shall apply to each of FIGS. 3H and 3I.

Figure 3H:
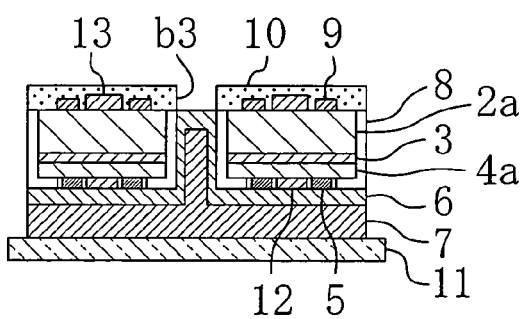
Figure 3I:
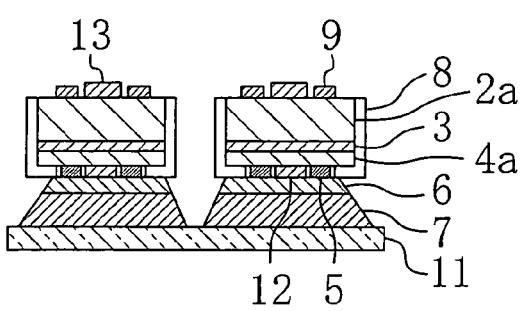

Next, as shown in FIG. 3H, the resist mask 10 is formed to cover the n-type electrodes 9 and the dielectric DBR mirrors 13 and then an opening b3 for partly opening the chip isolation region is formed in the resist mask 10. Subsequently, the sheet 11 having an adhesive property is adhered onto the surface of the Au plate 7 opposite to the surface thereof formed with the nitride semiconductor layers. Next, the respective portions of the passivation film 8 and the Ti film composing the underlying film 6 which are formed inside the opening a2 are removed by using BHF and then wet etching is performed with respect to Au composing the underlying film 6 and the Au plate 7 located under the Au by using iodine, thereby providing two mutually separated chips containing the nitride semiconductor layers. Thereafter, the resist mask 10 is removed by, e.g., organic cleaning, whereby the blue LEDs are fabricated.

Thus, in accordance with the method for fabricating semiconductor devices according to the third embodiment, the indiscrete Au plate is used as the holding member, unlike in the conventional embodiments, and device separation is performed not by cleavage but by removing the Au plate by wet etching. As shown in the conventional embodiments, cleavage for device separation has encountered the problem that the nitride semiconductor layers each having a small film thickness are naturally split or the plate layer remains in an indiscrete state and, as a result, device separation cannot be accomplished. However, the present embodiment can solve the problem and improve the yield. When the Au plate is etched, the nitride semiconductor layers are patterned and then etching is performed with respect to the Au plate from the side of the nitride semiconductor layers on which the sapphire substrate has been formed. In contrast to the conventional embodiments in which mask alignment has been difficult when the resist pattern is formed on the Au plate, the present embodiment facilitates mask alignment and improves the yield. In addition, the nitride semiconductor layers have been divided by dry etching into parts each of a size corresponding to one device when the laser lift-off process is performed. This prevents the splitting of a wafer during the laser lift-off process and improves the yield.

This allows the fabrication of blue LEDs with an excellently high yield. Each of the fabricated devices has an extremely excellent heat releasing property since heat is released through the thin-film Au plate with a thickness of 30 µm.

Although the present embodiment has described the case where the GaN layer is grown on the sapphire substrate 1, the present invention is also applicable to each of a substrate and a growth layer composed of other semiconductor materials.

EMBODIMENT 4

Referring to FIGS. 4A to 4G, a method for fabricating semiconductor devices according to a fourth embodiment of the present invention will be described by using, as a specific example, a method for fabricating field effect transistors each composed of a nitride semiconductor. In FIGS. 4A to 4G, the components corresponding to those shown in the drawings described above are designated by the same reference numerals.

Figure 4A:
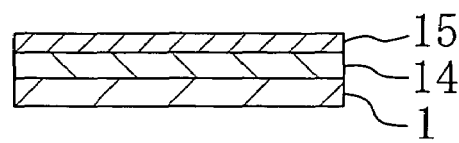
FIGS. 4A to 4G are cross-sectional views illustrating the principal process steps of a method for fabricating semiconductor devices according to a fourth embodiment of the present invention.

First, as shown in FIG. 4A, an n-type GaN layer 14 and an undoped GaN layer 15 are formed successively on the sapphire substrate 1 by MOCVD. Each of these growth layers has a typical film thickness of about 2 to 3 μm.

Figure 4B:
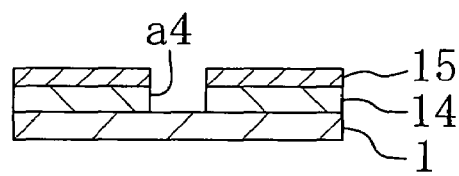

Next, as shown in FIG. 4B, a mask is formed on the undoped GaN layer 15 and then an opening a4 is formed in the n-type GaN layer 14 and the undoped GaN layer 15 by completely removing the portions of the nitride semiconductor layers which are present in the regions of the n-type GaN layer 14 and the undoped GaN layer 15 each of which serves as a device isolation region. Thereafter, the used mask is removed. As an etching gas for dry etching, a chlorine-based gas, e.g., is used preferably. The mask is preferably composed of a material resistant to dry etching such as a dielectric film made of $SiO_2$ or the like or a metal film made of Ni or the like. In the case of using a resist, the resist preferably has a large film thickness.

Figure 4C:
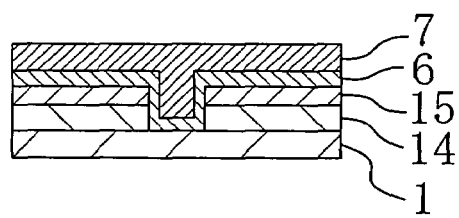

Next, as shown in FIG. 4C, a Ti/Au multilayer film is formed as the underlying film 6 for Au plate by EB vapor deposition over the entire surface of the sample and then the Au plate 7 is formed on the underlying film 6 to have a film thickness of 30 μm. The Au plate 7 operates as a member for holding the n-type GaN layer 14 when the sapphire substrate 1 is removed from the thin-film n-type GaN layer 14 in a subsequent step.

Figure 4D:
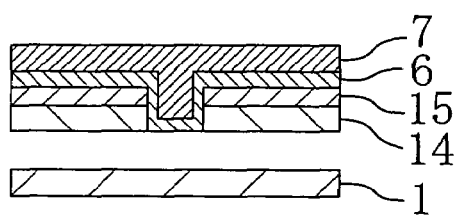

Next, as shown in FIG. 4D, the sapphire substrate 1 is removed from the n-type GaN layer 14. As a method for removing the sapphire substrate 1, a polishing process, a laser lift-off (LLO) process, or the like may be used. Since the sapphire substrate 1 is extremely firm and solid, the removal of the sapphire substrate 1 using a polishing process has the problem that it requires a long time and it is difficult to control. In view of the problem, the present embodiment has removed the sapphire substrate 1 by using the laser lift-off process. Specifically, the portion of the n-type GaN layer 14 located in proximity to the interface between the n-type GaN layer 14 and the sapphire substrate 1 is thermally decomposed by irradiating the surface of the sapphire substrate 1 opposite to the surface thereof formed with the n-type GaN layer 14 with a YAG laser so that the sapphire substrate 1 is separated from the n-type GaN layer 14. After the laser lift-off process, a Ga metal resulting from the decomposition is adhered to the portion of the n-type GaN layer 14 located in proximity to the interface so that it is removed by using a hydrochloric acid. By thus performing dry etching before the sapphire substrate 1 is separated by the laser lift-off process, the sapphire substrate 1 is separated from the individual parts of the n-type GaN layer 14 each corresponding to one device by the laser lift-off process. This allows the provision of a large margin for laser irradiation conditions and improves the yield in the same manner as in the second embodiment.

Figure 4E:
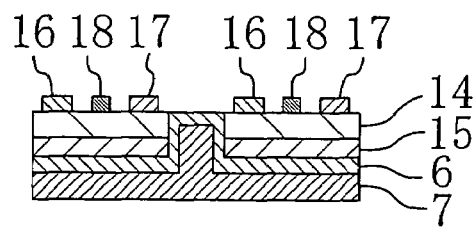

Next, as shown in FIG. 4E, source electrodes 16 and drain electrodes 17 each composed of, e.g., a Ti/Al multilayer film and gate electrodes 18 each composed of, e.g., a Pt/Au multilayer film are formed on the exposed surface of the n-type GaN layer 14 from which the sapphire substrate 1 has been separated by the lift-off process. To improve the high-frequency characteristics, a gate length should be shortened to a value of 0.5 μm or less.

Figure 4F:
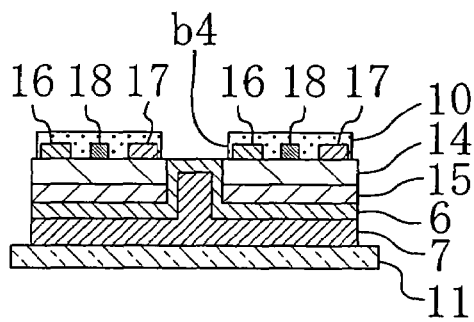

Next, as shown in FIG. 4F, the resist mask 10 is formed to cover the source electrodes 16, the drain electrodes 17, and the gate electrodes 18 and then an opening b4 for partly opening the chip isolation region is formed in the resist mask 10. Subsequently, the sheet 11 having an adhesive property is adhered onto the surface of the Au plate 7 opposite to the surface thereof formed with the nitride semiconductor layers.

Figure 4G:
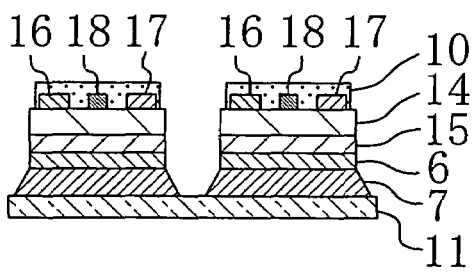

Next, as shown in FIG. 4G, the portion of the Ti film composing the underlying film 6 which is formed inside the opening a4 is removed by using HF and then wet etching is performed with respect to Au composing the underlying film 6 and the Au plate 7 located under the Au by using iodine, thereby providing two mutually separated chips containing the nitride semiconductor layers. Thereafter, the resist mask 10 is removed by, e.g., organic cleaning, whereby the field effect transistors are fabricated.

Thus, in accordance with the method for fabricating semiconductor devices according to the fourth embodiment, the indiscrete Au plate is used as the holding member, unlike in the conventional embodiments, and device separation is performed not by cleavage but by removing the Au plate by wet etching. As shown in the conventional embodiments, cleavage for device separation has encountered the problem that the nitride semiconductor layers each having a small film thickness are naturally split or the plate layer remains in an indiscrete state and, as a result, device separation cannot be accomplished. However, the present embodiment can solve the problem and improve the yield. When the Au plate is etched, a resist pattern is formed on the nitride semiconductor layers, the nitride semiconductor layers are patterned, and then etching is performed with respect to the Au plate from the side of the nitride semiconductor layer on which the sapphire substrate has been formed. In contrast to the conventional embodiments in which mask alignment has been difficult when the resist pattern is formed on the Au plate, the present embodiment facilitates mask alignment and improves the yield. In addition, the nitride semiconductor layers have been divided by dry etching into parts each of a size corresponding to one device when the laser lift-off process is performed. This prevents the splitting of a wafer during the laser lift-off process and improves the yield.

This allows the fabrication of field effect transistors with an excellently high yield. Each of the fabricated devices has an extremely excellent heat releasing property since heat is released through the thin-film Au plate with a thickness of 30 μm.

Although the present embodiment has described the case where the GaN layer is grown on the sapphire substrate 1, the present invention is also applicable to each of a substrate and a growth layer composed of other semiconductor materials.

EMBODIMENT 5

Referring to FIGS. 5A to 5G and FIGS. 6A and 6B, a method for fabricating semiconductor devices according to a fifth embodiment of the present invention will be described by using, as a specific example, a method for fabricating blue surface emitting devices each composed of a nitride semiconductor. In FIGS. 5A to 5G and FIGS. 6A and 6B, the components corresponding to those shown in the drawings described above are designated by the same reference numerals.

Figure 5A:
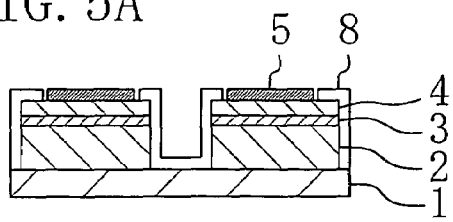
FIGS. 5A to 5G are cross-sectional views illustrating the principal process steps of a method for fabricating semiconductor devices according to a fifth embodiment of the present invention.

The steps inclusive of and precedent to the step shown by the cross-sectional view of FIG. 5A are the same as described above in the second embodiment with reference to FIGS. 2A to 2C.

Figure 5B:
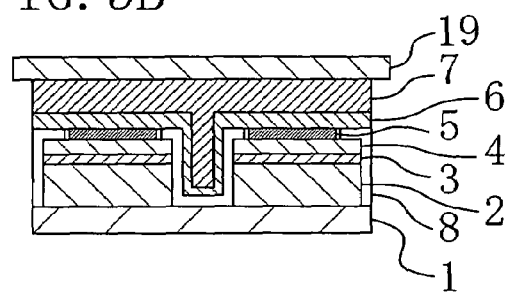

Next, as shown in FIG. 5B, a Ti/Au multilayer film is formed as the underlying film 6 for Au plate by EB vapor deposition over the entire surface of the sample and then the Au plate 7 is formed on the underlying film 6 to have a thickness of 10 μm. Then, an Si substrate 19 is bonded onto the Au plate 7 for the purpose of enhancing the ability to hold the thin-film nitride semiconductor layer after a laser lift-off process is performed in a subsequent step. Although a method which bonds the Si substrate 19 directly to the nitride semiconductor layer without intervention of the Au plate 7 may also be considered, it involves the risk that strain present in the Si substrate 19 is applied to the nitride semiconductor layer to degrade the characteristics of the devices. In view of the risk, the present embodiment has bonded the Si substrate 19 onto the Au plate 7. In this case, it is sufficient for the Au plate 7 to function as a buffer material in bonding the Si substrate 19 and therefore have a small film thickness. In the present embodiment, the thickness of the Au plate 7 has been adjusted to 10 µm. Although the description has been given to the case where the Si substrate 19 is bonded, the substrate preferably has a cleaving property and an excellent heat releasing property. Besides the Si substrate, a substrate made of, e.g., SiC, GaAs, or the like is used preferably.

Figure 5C:
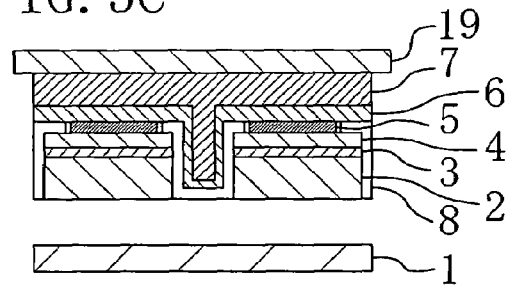

Next, as shown in FIG. 5C, the sapphire substrate 1 is removed from the n-type GaN layer 2. As a method for removing the sapphire substrate 1, a polishing process, a laser lift-off (LLO) process, or the like may be used. Since the sapphire substrate 1 is extremely firm and solid, the removal of the sapphire substrate 1 using a polishing process has the problem that it requires a long time and it is difficult to control. In view of the problem, the present embodiment has removed the sapphire substrate 1 by using the laser lift-off process. Specifically, the portion of the n-type GaN layer 2 located in proximity to the interface between the n-type GaN layer 2 and the sapphire substrate 1 is thermally decomposed by irradiating the surface of the sapphire substrate 1 opposite to the surface thereof formed with the n-type GaN layer 2 with a YAG laser so that the sapphire substrate 1 is separated from the n-type GaN layer 2. After the laser lift-off process, a Ga metal resulting from the decomposition is adhered to the portion of the n-type GaN layer 2 located in proximity to the interface so that it is removed by using a hydrochloric acid. By thus performing dry etching before the sapphire substrate 1 is separated by the laser lift-off process, the sapphire substrate 1 is separated from the individual parts of the n-type layer 2a each corresponding to one device by the laser lift-off process. This allows the provision of a large margin for laser irradiation conditions and improves the yield in the same manner as in the second embodiment. Because the laser lift-off process has roughened the surface, the light extraction efficiency of each of the LEDs is improved compared with the case where the surface is flat and even. It is also possible to further roughen the surface with the view to further improving the light extraction efficiency.

Figure 5D:
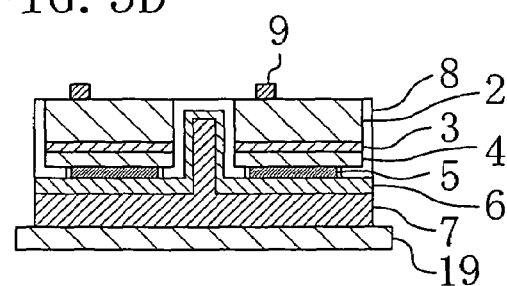

Next, as shown in FIG. 5D, Ti/Au multilayer films are formed as the n-type electrodes 9 by EB vapor deposition on the exposed surface of the n-type GaN layer 2 from which the sapphire substrate 1 has been separated and then sintering is performed in a nitrogen atmosphere at 600° C. The orientation of the drawing in each of FIGS. 5A to 5C has been vertically inverted from that of the drawing in FIG. 5D. The same shall apply to each of FIGS. 5E to 5G, which will be described later.

Figure 5E:
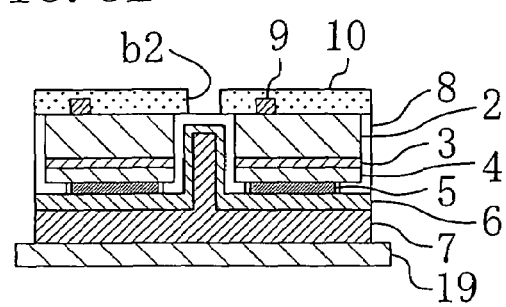

Next, as shown in FIG. 5E, the resist mask 10 is formed to cover the n-type electrodes 9 and then the opening b2 for partly opening the chip isolation region is formed in the resist mask 10.

Figure 5F:
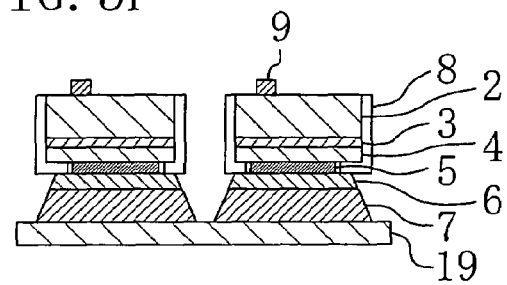

Next, as shown in FIG. 5F, the respective portions of the passivation film 8 and the Ti film composing the underlying film 6 which are formed inside the opening a2 are removed by using BHF and then Au composing the underlying film 6 and the Au plate 7 located under the Au is removed by wet etching using iodine. The reason for removing the Au plate 7 is that, if the Au plate 7 is in an indiscrete state without being separated when cleavage is performed in a subsequent step, there are cases where the cleavage cannot be performed easily. Thereafter, the resist mask 10 is removed by, e.g., organic cleaning.

Figure 5G:
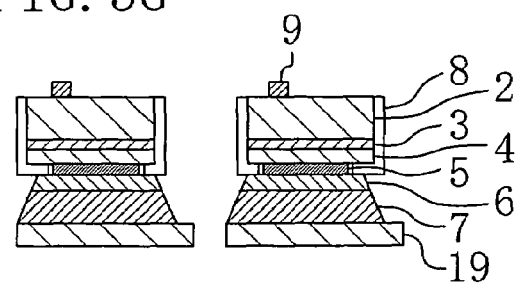

Next, as shown in FIG. 5G, the Si substrate 19 is polished till the film thickness thereof reaches 120 µm. Then, the Si substrate 19 is cleaved to provide two mutually separated chips containing the nitride semiconductor layers, whereby blue LEDs are fabricated.

A description will be given herein below to a method for further improving the yield in the method for fabricating semiconductor devices according to the present embodiment with reference to FIGS. 6A and 6B.

Figure 6A:
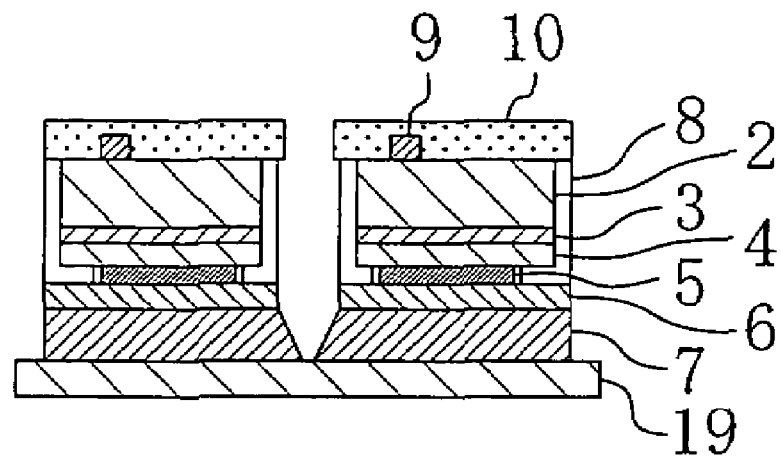
FIGS. 6A and 6B are cross-sectional views illustrating the principal process steps of the method for fabricating semiconductor devices according to the fifth embodiment.
Figure 6B:
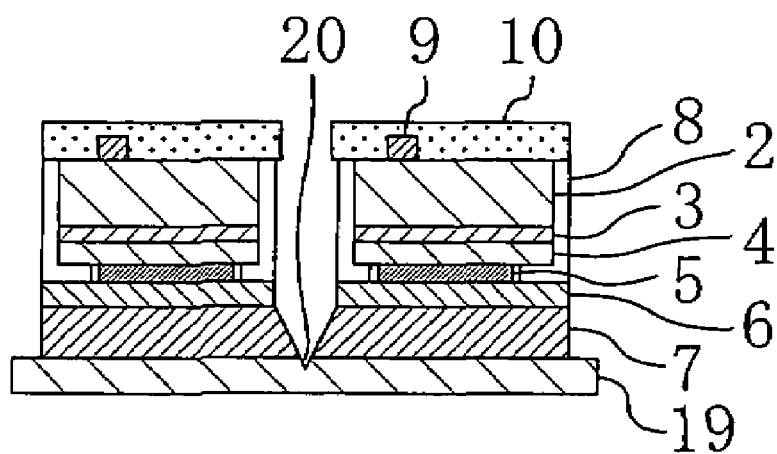
Figure 7A:
FIGS. 7A to 7F are cross-sectional views illustrating the principal process steps of a method for fabricating semiconductor devices according to a first conventional embodiment.
Figure 7B:
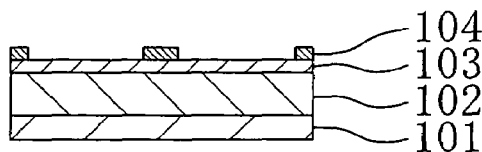
Figure 7C:
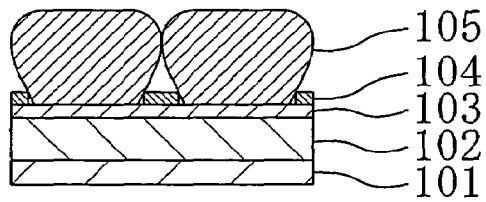
Figure 7D:
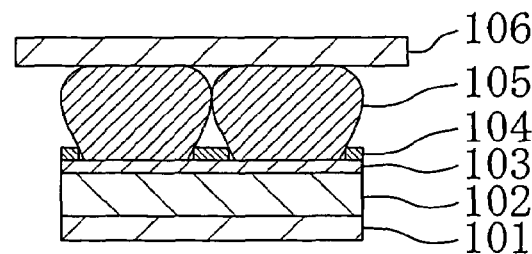
Figure 7E:
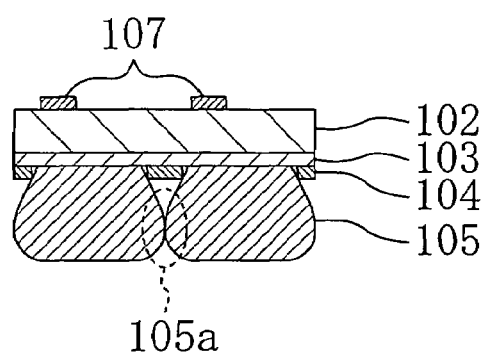
Figure 7F:
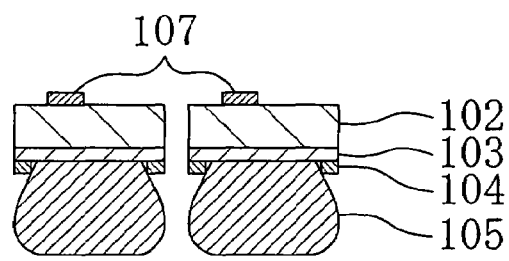
Figure 8A:
FIGS. 8A to 8F are cross-sectional views illustrating the principal process steps of a method for fabricating semiconductor devices according to a second conventional embodiment.
Figure 8B:
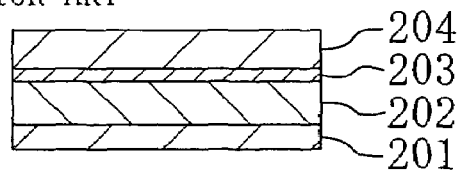
Figure 8C:
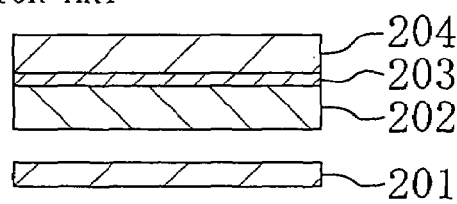
Figure 8D:
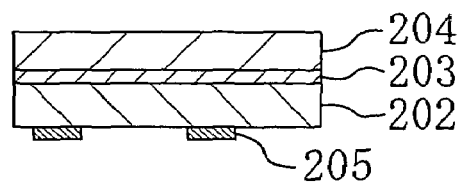
Figure 8E:
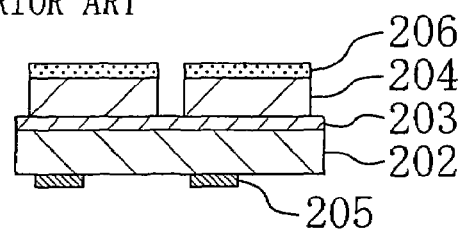
Figure 8F:
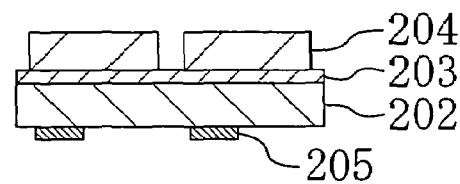

The steps inclusive of and precedent to the step shown by FIG. 6A are the same as described above with reference to FIGS. 5A to 5E.

First, as shown in FIG. 6A, the Au plate 7 is removed in the same manner as in the description given above with reference to FIG. 5F. Then, as shown in FIG. 6B, a trench 20 is formed in the Si substrate 19 by performing wet etching with respect to the exposed Si substrate 19 from which the Au plate 7 has been removed. By thus forming the trench 20, the cleavage of the Si substrate 19 occurs along the trench 20 so that a shift in cleavage position prevents a reduction in yield. Thereafter, the resist mask 10 is removed by, e.g., organic cleaning in the same manner as in the step described above.

Thus, the method for fabricating semiconductor devices according to the fifth embodiment has removed the Au plate by wet etching before performing cleavage. This allows desired cleavage to be performed by preventing the situation in which a wafer is naturally split or the device separation cannot be performed and improves the yield. When the Au plate is etched, a resist pattern is formed on the nitride semiconductor layers, the nitride semiconductor layers are patterned, and then etching is performed with respect to the Au plate from the side of the nitride semiconductor layers on which the sapphire substrate has been formed. In contrast to the conventional embodiments in which mask alignment has been difficult when the resist pattern is formed on the Au plate, the present embodiment facilitates mask alignment and improves the yield. In addition, the nitride semiconductor layers have been divided by dry etching into parts each of a size corresponding to one device when the laser lift-off process is performed. This prevents the splitting of a wafer during the laser lift-off process and improves the yield.

Since the present embodiment has bonded the Si substrate onto the Au plate, the ability to hold the thin-film nitride semiconductor layers after the laser lift-off process is enhanced so that the yield is improved. In addition, the fabricated devices are formed on the Si substrate so that it is no more necessary to attach a heat sink in a mounting step and the mounting step is thereby simplified.

This allows the fabrication of blue LEDs with an excellently high yield. Each of the fabricated devices has an extremely excellent heat releasing property since heat is released through the thin-film Au plate having a film thickness of 30 µm.

Although the present embodiment has described the case where the GaN layer is grown on the sapphire substrate 1, the present invention is also applicable to each of a substrate and a growth layer composed of other semiconductor materials.

The present invention is useful for a method for fabricating semiconductor devices each composed of a nitride semiconductor.

What is claimed is:

1. A method for fabricating semiconductor devices, the method comprising the steps of:

forming a semiconductor layer containing a positive layer on a mother substrate;

forming a metal layer on the semiconductor layer;

separating the mother substrate from the semiconductor layer after forming the metal layer, thereby exposing a surface of the semiconductor layer; and removing a desired region of the metal layer from the direction of the exposed surface of the semiconductor layer to form a plurality of mutually separated semiconductor devices each containing the semiconductor layer, wherein the metal layer has a film thickness of 10 µm or more.

2. The method of claim 1, wherein the metal layer is composed of Au, Ag, or Cu.

3. The method of claim 1, wherein the metal layer is formed by plating.

4. The method of claim 1, wherein the step of separating the mother substrate is performed by irradiating a side of the semiconductor layer formed with the mother substrate with a laser.

5. The method of claim 1, wherein the step of separating the mother substrate is performed by polishing.

6. The method of claim 1, further comprising, between the step of forming the semiconductor layer and the step of separating the mother substrate, the step of:

partly removing the semiconductor layer from a side of the semiconductor layer opposite to the side thereof formed with the mother substrate to separate the semiconductor layer into a plurality of regions, wherein the plurality of semiconductor devices contain the plurality of respective regions.

7. The method of claim 1, further comprising, between the step of forming the metal layer and the step of forming the plurality of semiconductor devices, the step of:

forming a polymer material film having an adhesive property on a surface of the metal layer opposite to a surface thereof formed with the semiconductor layer.

8. The method of claim 7, wherein the polymer material film is composed of a material having a stretching property.

9. The method of claim 1, further comprising, between the step of forming the metal layer and the step of separating the mother substrate, the step of:

forming a semiconductor substrate having a cleaving property on a surface of the metal layer opposite to a surface thereof formed with the semiconductor layer.

10. The method of claim 9, wherein the semiconductor substrate is composed of Si or SiC.

11. The method of claim 9, wherein the step of forming the plurality of semiconductor devices includes the steps of:

forming a trenched portion in a surface of the semiconductor substrate which has been exposed by removing the desired region of the metal layer; and cleaving the semiconductor substrate formed with the trenched portion to form the plurality of semiconductor devices.

12. The method of claim 1, wherein the semiconductor layer is composed of a group III nitride semiconductor.

13. The method of claim 1, further comprising, after the step of separating the mother substrate and before the step of removing the desired region of the metal layer, the step of:

forming a passivation film on the semiconductor layer.

* * * * *